United States Patent
Neckel et al.

(10) Patent No.: US 6,311,401 B1
(45) Date of Patent: Nov. 6, 2001

(54) STEERING ANGLE SENSOR WITH EVALUATION OF THE INCREMENTAL TRACK FOR ABSOLUTE VALUE DETERMINATION

(75) Inventors: Klaus Neckel, Vaihingen; Bernd Wigger, Kirchheim/Neckar, both of (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/101,542

(22) PCT Filed: Jan. 10, 1997

(86) PCT No.: PCT/EP97/00096

§ 371 Date: Apr. 15, 1999

§ 102(e) Date: Apr. 15, 1999

(87) PCT Pub. No.: WO97/26174

PCT Pub. Date: Jul. 24, 1997

(30) Foreign Application Priority Data

Jan. 18, 1996 (DE) ................................. 196 01 676

(51) Int. Cl.$^7$ ............................... G01B 7/00; H03M 1/22
(52) U.S. Cl. .......................... 33/1 PT; 33/1 N; 341/15
(58) Field of Search ......................... 33/1 PT, 1 N, 33/534, 762, 763; 341/15

(56) References Cited

U.S. PATENT DOCUMENTS

| | | | |
|---|---|---|---|
| 4,626,682 | * 12/1986 | Hara et al. | 33/1 N |
| 4,636,997 | 1/1987 | Toyama et al. | |
| 5,301,434 | * 4/1994 | Imaizumi | 33/1 PT |
| 5,473,237 | * 12/1995 | Steinech et al. | 318/605 |
| 5,646,523 | * 7/1997 | Kaiser et al. | 341/15 |
| 5,686,804 | * 11/1997 | Siraky | 318/640 |
| 5,930,905 | * 8/1999 | Zabler et al. | 33/1 PT |

FOREIGN PATENT DOCUMENTS

| | | |
|---|---|---|
| 3942248 | 7/1990 | (DE) . |
| 4009007 | 9/1990 | (DE) . |
| 4041491 | 6/1992 | (DE) . |
| 4136888 | 5/1993 | (DE) . |
| 4409892 | 9/1995 | (DE) . |
| 2287917 | 10/1995 | (GB) . |
| 97/09588 | 3/1997 | (WO) . |
| 97/26174 | 7/1997 | (WO) . |

OTHER PUBLICATIONS

English Translation of the International Preliminary Examination Report for Application PCT/EP97/00096.
Search Report of the German Patent Office Relating to Parent German Patent Application No. PCT/EP97/00096 filed Jan. 10, 1997.

* cited by examiner

Primary Examiner—Christopher W. Fulton
Assistant Examiner—Quyen Doan
(74) Attorney, Agent, or Firm—Rader, Fishman & Grauer PLLC

(57) ABSTRACT

This invention relates to a steering angle sensor wherein the angle values are determined by the position of a code disk provided with an incremental track and a code track. So as to be able to express the 8-step-code-word-defined precision by means of six-step code words on the code track the six-step code words are supplemented by 2 bit resulting from the momentary state of the incremental track scanned by two detectors.

11 Claims, 1 Drawing Sheet

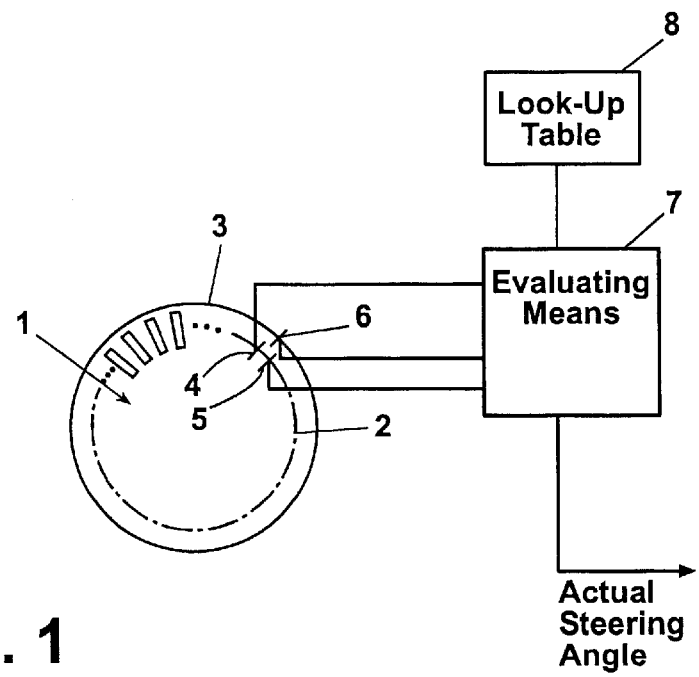
Fig. 1
Fig. 2 Channel 1
Fig. 3 Channel 2
Fig. 4 Code Track
Fig. 5 Track 1
Fig. 6 Track 2
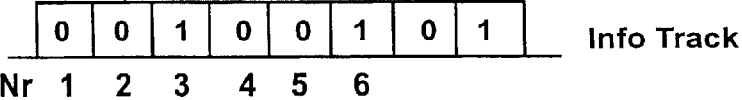
Fig. 7 Info Track

STEERING ANGLE SENSOR WITH EVALUATION OF THE INCREMENTAL TRACK FOR ABSOLUTE VALUE DETERMINATION

TECHNICAL FIELD

This invention generally relates to angle sensors and more particularly relates to steering angle sensors for measuring absolute angular deflections.

BACKGROUND OF THE INVENTION

In driving stability control, it is, besides other parameters, necessary to know the instantaneous steering angle of the vehicle. As this steering angle depends on the rotational position of the steering wheel it has become usual to determine the steering angle by means of the position of rotation of the steering wheel of a vehicle. To this end, the steering wheel is coupled with a modulator modulating a continuous signal indicative of the rotational position of the steering wheel. This can be done by the modulation of a constant magnetic field or, as well, of a constant light beam. In the present case, a light beam is modulated by the teeth of a code disk. The teeth are arranged in two circular tracks. While the first track as incremental track features a number of teeth evenly distributed over the periphery of the circle and scanned by two sensors staggered by 90 degrees (one tooth period=360 degrees) the so-called absolute track has a chain code distributed over the periphery of a circle and indicating the absolute value of the disk position. Details in this respect have already been described in connection with patent application 195 32 903.1 and thus are not to be explained in further detail.

The background for selecting the two tracks mentioned is that it is possible to determine both the direction of rotation of the steering wheel and the momentary stepwise angle changes in the position of the steering wheel by means of the incremental track by way of the two sensors. On the other hand, these data do not enable the determination of the initial angle position of the steering wheel upon the turning-on of measurement such as upon the start of the vehicle since, in this case, it is possible to define but relative changes only if the electric power supply necessary for the steering angle determination has been switched on and if, at least, a small change in the angle of rotation of the steering wheel has taken place.

In the abovementioned patent application a resolution of 1.5 degrees was suggested with regard to the absolute value which corresponds to a tooth number of 60 teeth on the incremental track. 240 steps were defined with regard to the step number of the absolute value code. Thus, there results an initialisation angle of 12 degrees with a total of three sensors.

So as to be able to define, at least, 240 different values on the absolute value track an 8-bit code is nessecary which allows the definition of 256 steps at the maximum. The manufacture of such a big step number in a comparatively small code disk is only possible by selecting comparatively high tolerances and is thus quite difficult and expensive.

It is an object of this invention to reduce the number of bits on the absolute track that are needed for the step number of a code.

This object is achieved by the present invention by using the code track and also the momentary position of the incremental track, relative to the two sensors scanning this track, in order to determine the absolute value of the steering wheel angle. In this way, it is possible to obtain at least 1 bit of the needed 8 bit from the incremental track. Advantageous further embodiments show that, additionally, it is even possible to obtain a second bit from the state of the incremental track so that it is possible to cut down on 2 bit on the absolute track, the evaluation of 6 bit being sufficient there. Thus, it will be sufficient to code 60 values on the absolute track instead of 240 values.

Further above, it was already mentioned that at least 1 bit of coding of the absolute track can be saved by applying the present invention. Thence it follows that, with the resolution being the same, the number of the values exclusively determinable by the absolute track is halved.

So as to be also able to recognise the direction of rotation of the steering wheel, the incremental track is scanned by two sensors. According to a preferred embodiment, it is expedient to define the actual absolute steering angle, i.e. the absolute value determinable by means of the incremental track and the absolute track, by 8 bit whereby it will be no problem to express 240 different values which corresponds to a resolution of 1.5 degrees. Such a resolution is quite sufficient for the at present current driving stability control systems. This invention, however, will also be expedient in cases where a higher resolution is desired.

The present invention also allows the absolute value to be defined by six bits as it relates to the absolute track and to take the additional required 2 bit from the two output signals of the incremental sensors. As the six-digit code on the absolute value track is to be a chain code it is possible to get along with approximately 70 steps on the absolute track which considerably simplifies the manufacture of the code disk.

Using a chain code puts strong restrictions on selecting the code values on the absolute track since, each time, six consecutively read bit are not to be repeated on the track. Further, the present invention teaches the assignment of stepwise changing absolute angle values to these abruptly changing code values.

BRIEF DESCRIPTION OF THE DRAWINGS

FIG. 1 is a schematic representation of the track distribution on a code disk.

FIGS. 2 through 4 are the output signals of the individual detectors.

FIGS. 5 through 7 are the composition of the 8-bit code word from the contents of the individual tracks.

DETAILED DESCRIPTION OF THE PREFERRED EMBODIMENTS

FIG. 1 is a code disk 1 with an inside incremental track 2 and an outside code track 3 for representing the absolute value code. The tracks feature individual teeth evenly distributed over the periphery of the circle as far as the incremental track 2 is concerned while in the code track 3 the availability or non-availability of a tooth represents 1 bit at a time of a six-step code. Thus, the sequence of teeth and tooth gaps, respectively, on the code track 3 always represents a six-step code word, with at least 60 code words resulting. The beginning of the code words will come on each time, shifted by one tooth width, and the individual code words are superimposed on one another, shifted by one tooth. Such a code is called a chain code. The measures for detecting such a chain code where the individual code words have different contents and where, all the same, five steps of the new six-digit code word have been taken over from the neighbouring code word are not to be described here and are not the subject matter of the present invention.

In FIG. 1, there are to be discerned the detectors 4 through 6. Each of the individual detectors is provided with a light receiver transforming the light beam, modulated by the teeth passing by in rotation, into electrical signals. The code track 3 has but one sole detector 6 while the incremental track 2 is equipped with two detectors staggered by 90 degrees relative to each other. The 90 degrees refer to the associated tooth frequency.

FIGS. 2 and 3 represent the output signals of the detectors 4 and 5 squared by pulse shapers and denominated as channels 1 and 2. FIG. 4 represents the output signal of detector 6 transformed into square signals. The output signals represented in FIGS. 2 through 4 are placed on top of each other, consistent with regard to the time scale used. It is to be discerned from the Figures that the moments of time of the flank change in channnels 1 and 2 each time are the scanning times of the code track according to FIG. 4. During one period of the incremental track, thus, the code track is scanned four times due to the two flank changes in each of the channels 1 and 2.

FIGS. 5 through 7 represent the inventive principle. It is assumed that, on the infotrack, there starts the reading of the pertinent code word with the ascending flank on the incremental track 2. At this time (bit no. 1), value 0 is read on the infotrack. During the subsequent ascending flank of the incremental track 2 the infotrack, again, shows value 0 as bit no. 2. The next scanning time of the infotrack coincides with the descending flank of the incremental track 2, with a value "1" resulting as bit no. 3. During the subsequent three flank changes, on the inside track, there will be read the values 001 as bit nos. 4, 5, and 6. Thus, a six-step bit word is obtained. However, so as to be able to define the desired 240 different angle values there actually would be needed code words featuring 8 bit. In accordance with this invention, help is provided in that the direction of the flank change on the two incremental tracks is added as information pertinent to the code word, thus in total an 8-bit code word resulting. In an evaluation device or means 7 of the steering angle sensor a table 8 (e.g., a look-up table) is provided wherein the pertinent angle values are assigned to the determined code words. To this end, it is, e.g., possible to add the two first flank changes of the incremental tracks, both ascending, as values "1", "1" to the six-step code of the code track in FIG. 7. The sequence of the first two flank changes, e.g., can be considered to indicate the pages of a table on which pages there are to be read the angle values pertinent to the six-step code words from the table. Thus, different angle values will result in the evaluation table for the same code depending on whether the two pertinent flank changes of the incremental tracks 1 and 2 feature the values of 11 or 10 or 00 or 01, respectively. It is left to definition whether the two leading flank changes on the incremental track or defined subsequent flank changes, such as the two flank changes appearing after the read code word, are used for the denomination of the table pages. As a result, however, it is to be stated that this invention enables an 8-bit-precision absolute value although the pertinent code words on the infotrack only are 6-bit code words.

What is claimed is:

1. A steering angle sensor for determining an absolute angular value, comprising:
    a code disk including an absolute track having a chain code distributed over a periphery thereof indicative of absolute values of an angular position of the disk and at least has one incremental track having teeth evenly distributed over a periphery thereof for indicating a momentary stepwise angle change of the disk;
    means for measuring the momentary state of the incremental track and the momentary value of the absolute track; and
    means for evaluating the code disk, momentary state of the incremental track and the momentary value of the absolute track to determine the actual steering angle wherein the momentary value of the absolute track comprises a digital word corresponding to the chain code determined over a predetermined number of stepwise angle changes of the incremental track, the evaluating means determining digital information corresponding to a direction of a flank change of the momentary state of the incremental track during one of said predetermined number of stepwise angle change.

2. A steering angle sensor as claimed in claim 1, wherein the incremental track is scanned by two sensors staggered by 90 degrees.

3. A steering angle sensor as claimed in claim 1, wherein the precision of the absolute value is defined so that the same is unequivocally determinable by an 8-bit code.

4. A steering angle sensor s claimed in claim 3, wherein the 2 bit of the 8-bit code are determined by the two momentary output values of the two incremental sensors and 6 bit are determined by the relevant chain code on the absolute track.

5. A steering angel sensor as claimed in claim 1, wherein the actual absolute value may adopt any of 240 different values so that the resolution of the absolute value is 1.5 degrees.

6. A steering angle sensor as claimed in claim 1, further including a look-up table wherein the pertinent angle values are assigned to the determined code words.

7. A steering angle sensor as claimed in claim 1, wherein the digital information comprises the direction of the flank changes of respective outputs of the two sensors to thereby define a 2-bit code.

8. A steering angle sensor claimed in claim 7, wherein the digital word comprises a 6-bit chain code, the actual steering angle being represented by a concatenation of the 2-bit code and the 6-bit chain code.

9. A steering angle sensor as claimed in claim 1, wherein the direction of the flank change is determined in accordance with the leading flank change from the incremental track for the predetermined number of stepwise angle changes.

10. A steering angle sensor as claimed in claim 1, wherein the direction of the flank change is determined in accordance with flank changes subsequent to a leading change from the incremental track.

11. A steering angle sensor as claimed in claim 1, wherein a low to high flank change defines a logic one, and a high to a low flank change defines a logic zero.

* * * * *